(12) United States Patent
Lambrache et al.

(10) Patent No.: US 7,710,814 B2
(45) Date of Patent: May 4, 2010

(54) FAST READ PORT FOR REGISTER FILE

(75) Inventors: Emil Lambrache, San Jose, CA (US); Benjamin F. Froemming, San Jose, CA (US)

(73) Assignee: Atmel Corporation, San Jose, CA (US)

( * ) Notice: Subject to any disclaimer, the term of this patent is extended or adjusted under 35 U.S.C. 154(b) by 119 days.

(21) Appl. No.: 11/926,296

(22) Filed: Oct. 29, 2007

(65) Prior Publication Data

US 2008/0259712 A1    Oct. 23, 2008

Related U.S. Application Data

(60) Continuation of application No. 11/738,173, filed on Apr. 20, 2007, now abandoned, which is a division of application No. 11/130,929, filed on May 17, 2005, now Pat. No. 7,224,635.

(60) Provisional application No. 60/658,473, filed on Mar. 4, 2005.

(51) Int. Cl.
    *G11C 8/00* (2006.01)
(52) U.S. Cl. ............................. 365/230.05; 365/189.04
(58) Field of Classification Search ............ 365/230.05, 365/189.04, 154, 230.03
    See application file for complete search history.

(56) References Cited

U.S. PATENT DOCUMENTS

| | | | |
|---|---|---|---|
| 4,903,235 A | 2/1990 | Kubota et al. | |
| 5,434,822 A | 7/1995 | Deleganes et al. | |
| 5,710,742 A | 1/1998 | Carter et al. | |
| 5,742,557 A | 4/1998 | Gibbins et al. | |
| 5,777,928 A | 7/1998 | Vidwans et al. | |
| 5,790,461 A | 8/1998 | Holst | |
| 5,828,610 A | 10/1998 | Rogers et al. | |
| 6,005,794 A | 12/1999 | Sheffield et al. | |

(Continued)

FOREIGN PATENT DOCUMENTS

WO    WO-06096265 A2    9/2006

OTHER PUBLICATIONS

"U.S. Appl. No. 20068007156.6 ,CN Office Action mailed Oct. 15, 2009", 7 pgs.

(Continued)

*Primary Examiner*—Vu A Le
(74) *Attorney, Agent, or Firm*—Schwegman, Lundberg & Woessner, P.A.

(57) ABSTRACT

Separate read and write ports in a memory system allow simultaneous access to a memory cell array by read and write operations. A single cycle operation of a central processing unit coupled to a memory array depends on a memory access capability providing simultaneous reading and writing to different locations. A pair of pull-down transistor stacks connected to memory cell latch loops allows a single selected pull-down stack of the pair to toggle a memory cell latch loop to a desired data content without any requirement for a pre-charge scheme. A single pull-down stack of transistors connected to a memory cell latch loop provides a read port with low input loading. A sense amplifier provides a mid-supply-level precharging capability provided by a feedback device within a front-end inversion stage. When not in a feedback mode, the front-end inversion stage cascaded with a second inversion stage provides a rapid read response.

30 Claims, 11 Drawing Sheets

U.S. PATENT DOCUMENTS

| | | | |
|---|---|---|---|
| 6,104,663 | A | 8/2000 | Kablanian |
| 6,504,788 | B1 | 1/2003 | Nii et al. |
| 6,671,206 | B2 | 12/2003 | Vali et al. |
| 6,834,024 | B2 * | 12/2004 | Frydel .................... 365/230.05 |
| 6,873,565 | B1 | 3/2005 | Riedlinger, Reid, et al. |
| 7,221,607 | B1 * | 5/2007 | Vernenker et al. ...... 365/189.16 |
| 7,224,635 | B2 | 5/2007 | Lambrache |
| 7,304,904 | B2 | 12/2007 | Lambrache et al. |
| 7,397,723 | B2 | 7/2008 | Lambrache et al. |
| 2002/0110024 | A1 * | 8/2002 | Ouellette et al. ........ 365/189.04 |
| 2007/0189101 | A1 | 8/2007 | Lambrache et al. |

OTHER PUBLICATIONS

"U.S. Appl. No. 11/130,929, Non Final Office Action mailed Oct. 10, 2006", 5 pgs.

"U.S. Appl. No. 11/130,929, Notice of Allowance mailed Jan. 26, 2007", 3 pgs.

"U.S. Appl. No. 11/130,929, Preliminary Amendment filed May 17, 2005", 3 pgs.

"U.S. Appl. No. 11/130,929, Response filed Jan. 8, 2007 to Non Final Office Action mailed Oct. 10, 2006", 12 pgs.

"U.S. Appl. No. 11/130,929, Response filed Sep. 21, 2006 to Restriction Requirement mailed Aug. 21, 2006", 1 pg.

"U.S. Appl. No. 11/130,929, Restriction Requirement mailed Aug. 21, 2006", 5 pgs.

"U.S. Appl. No. 11/738,173, Notice of Allowance mailed Sep. 5, 2007", 3 pgs.

"U.S. Appl. No. 11/738,207, Notice of Allowance mailed Aug. 23, 2007", 3 pgs.

"U.S. Appl. No. 11/738,233, Final Office Action mailed Dec. 10, 2007", 6 pgs.

"U.S. Appl. No. 11/738,233, Non Final Office Action mailed Aug. 21, 2007", 4 pgs.

"U.S. Appl. No. 11/738,233, Notice of Allowance mailed Mar. 4, 2008", 4 pgs.

"U.S. Appl. No. 11/738,233, Response filed Feb. 11, 2008 to Final Office Action mailed Dec. 10, 2007", 8 pgs.

"U.S. Appl. No. 11/738,233, Response filed Nov. 21, 2007 to Non Final Office Action mailed Aug. 21, 2007", 10 pgs.

2006221060, "Australian Application No-2006221060, Office Action Mailed Feb. 6, 2009", 2 pgs.

* cited by examiner

FAST READ PORT FOR REGISTER FILE

CROSS-REFERENCE TO RELATED APPLICATION

This application is a continuation of U.S. patent application Ser. No. 11/738,173, filed Apr. 20, 2007, which is a divisional of U.S. patent application Ser. No. 11/130,929, filed May 17, 2005, now issued as U.S. Pat. No. 7,224,635, which claims benefit of Provisional Application No. 60/658,473, filed Mar. 4, 2005.

TECHNICAL FIELD

The invention relates to memory systems and read operations. More specifically, the invention is a single-ended read port and sense amplifier with integral precharge capability.

BACKGROUND ART

A static memory cell constructed from six transistors is commonly applied in memory designs to fulfill requirements for short access cycle times, high-frequency data rates, low power consumption, and excellent immunity from extreme environmental conditions.

With reference to FIG. 1A a six transistor (6-T) cell latches digital data in a memory cell latch loop formed by a pair of cross-coupled inverters in a prior art static memory cell diagram 101. A first complementary inverter is constructed from a first PMOS transistor 115 and a first NMOS transistor 125. A second complementary inverter is constructed from a second PMOS transistor 120 and a second NMOS transistor 130. A pair of access devices is used to connect and disconnect the memory cell latch loop from a bitline BL and a complementary bitline $\overline{BL}$. The access devices are a third NMOS transistor 105 connected to the input of the first complementary inverter and a fourth NMOS transistor 110 connected to the input of the second complementary inverter. The access devices are enabled by a select signal on a wordline WL.

With reference to FIG. 1B a memory cell latch loop is represented as cross-coupled inverters 140, 145 and has two pairs of access devices forming two access ports in a prior art dual port memory cell diagram 102. Utilization of a memory array improves with simultaneous access to two different memory locations provided by dual memory ports. A first access port is formed by a first pair of NMOS transistors 110, 105 connecting from the memory cell latch loop to a first bitline BL1 and a first complementary bitline $\overline{BL1}$. A first wordline WL1 enables the first pair of access devices. A second access port is formed by a second pair of NMOS transistors 165, 160 connecting from the memory cell latch loop to a second bitline BL2 and a second complementary bitline $\overline{BL2}$. A second wordline WL2 enables the second pair of access devices.

With reference to FIG. 1C a row decoder 180 selects wordlines connected to memory cells within a memory cell array 170 in a prior art memory system diagram 103. A column decoder 185 selects the bitlines of the memory cells. Sense and write amplifiers 190 connect to the bitlines for reading and writing memory cells after a pair of bitlines is selected. A control block 175 connects to the row decoder 180, the column decoder 185, and a sense and write amplifier 190 to provide addresses and control signals for read and write operations.

U.S. Pat. No. 6,005,794 entitled "Static Memory with Low Power Write Port" to Sheffield et al. describes write port circuits of a static memory cell that include a first conditional conduction path between a first output of a latch and ground active if and only if both a wordline input and a write data true bitline input receive active signals. The write port circuit includes a second conditional conduction path between a second output of the latch and ground active if and only if both the wordline and a write data complement bitline receive active signals. The first and second conditional conduction paths may be formed by a series connection of the source-drain paths of two transistors. In each conditional conduction path the gate of a first transistor receives a corresponding column signal and the gate of a second transistor is connected to the wordline. The wordline transistors may be shared between bitline transistors of a single memory cell or of memory cells in plural contiguous adjacent columns. The memory cells may include a plurality of write ports with the write port circuit used for each port instance. While the '794 patent uses both a pulldown stack and a pullup stack to drive the read bitline, two PMOS transistors are required in each pullup stack replicated in every cell. The pullup stack replication increases an overall memory array size and complexity.

With reference to FIG. 2, a transfer curve 210 in a prior art inverter transfer characteristic diagram 200 transitions an equal potential line 205 at a point with an intercept of the $V_{in}$ axis (abscissa) and $V_{out}$ axis (ordinate) at about $$\frac{V_{DD}}{2}.$$

The equal potential line is a locus of points defined by an input voltage equaling an output voltage ($V_{out}=V_{in}$). The equal potential line is therefore a line at a 45 degree angle commencing from the origin. The transfer characteristic of the inverter is generic, having a low level input voltage $V_{in}$ corresponding to a high level output voltage $V_{out}$ and vice versa. In the case of a CMOS transistor implementation of the inverter, the beta ratios of the pull-up device and the pull-down device are matched to effect the transfer curve crossing of the equal potential line at about $$\frac{V_{DD}}{2}.$$

More specifically, the pull-up and pull-down device are operating in their respective saturation regions at the operating point $$V_{in} = \frac{V_{DD}}{2}.$$

In order for the transfer curve transition of the equal potential line to occur at about $$\frac{V_{DD}}{2},$$

the following design considerations are followed as closely as possible: With the saturation current of the p-type pull-up device being $$I_{dsp} = -\frac{\beta_p}{2}(V_{in} - V_{DD} - V_{tp})^2,$$

the saturation current of the n-type pull-down device being $$I_{dsn} = \frac{\beta_n}{2}(V_{in} - V_{tn})^2,$$

and with a series connection of the pull-up and pull-down devices, then $I_{dsp}=-I_{dsn}$. Solving for $V_{in}$:

$$V_{in} = \frac{V_{DD} + V_{tp} + V_{tn}\sqrt{\frac{\beta_n}{\beta_p}}}{1 + \sqrt{\frac{\beta_n}{\beta_p}}}$$

and setting $\beta_n=\beta_p$ and $V_{tn}=-V_{tp}$, the result is $$Vin = \frac{V_{DD}}{2}.$$

SUMMARY

Separate read and write ports in a memory system allow simultaneous access to a memory cell array in read and write operations. A single cycle operation of a central processing unit coupled to a memory cell array depends on a memory access capability incorporating simultaneous read and write operations. A pair of pull-down transistor stacks coupled to a memory cell latch loop allow a selected single pull-down stack of the pair to toggle the memory cell latch loop to a desired data content without any requirement for a precharge scheme. An additional single pull-down stack of transistors connected to a memory cell latch loop provides a read port with low input loading and minimal likelihood of upsetting a memory cell data content in a read operation. A sense amplifier provides a mid-supply-level precharge capability produced by a feedback device within a front-end inversion stage. The front-end inversion stage, cascaded with a second inversion stage, provides a rapid read response. A memory cell of the present invention may be used for a register file, a specialized SRAM, or a generic SRAM.

DETAILED DESCRIPTION AND BEST MODE

Figure 3A:
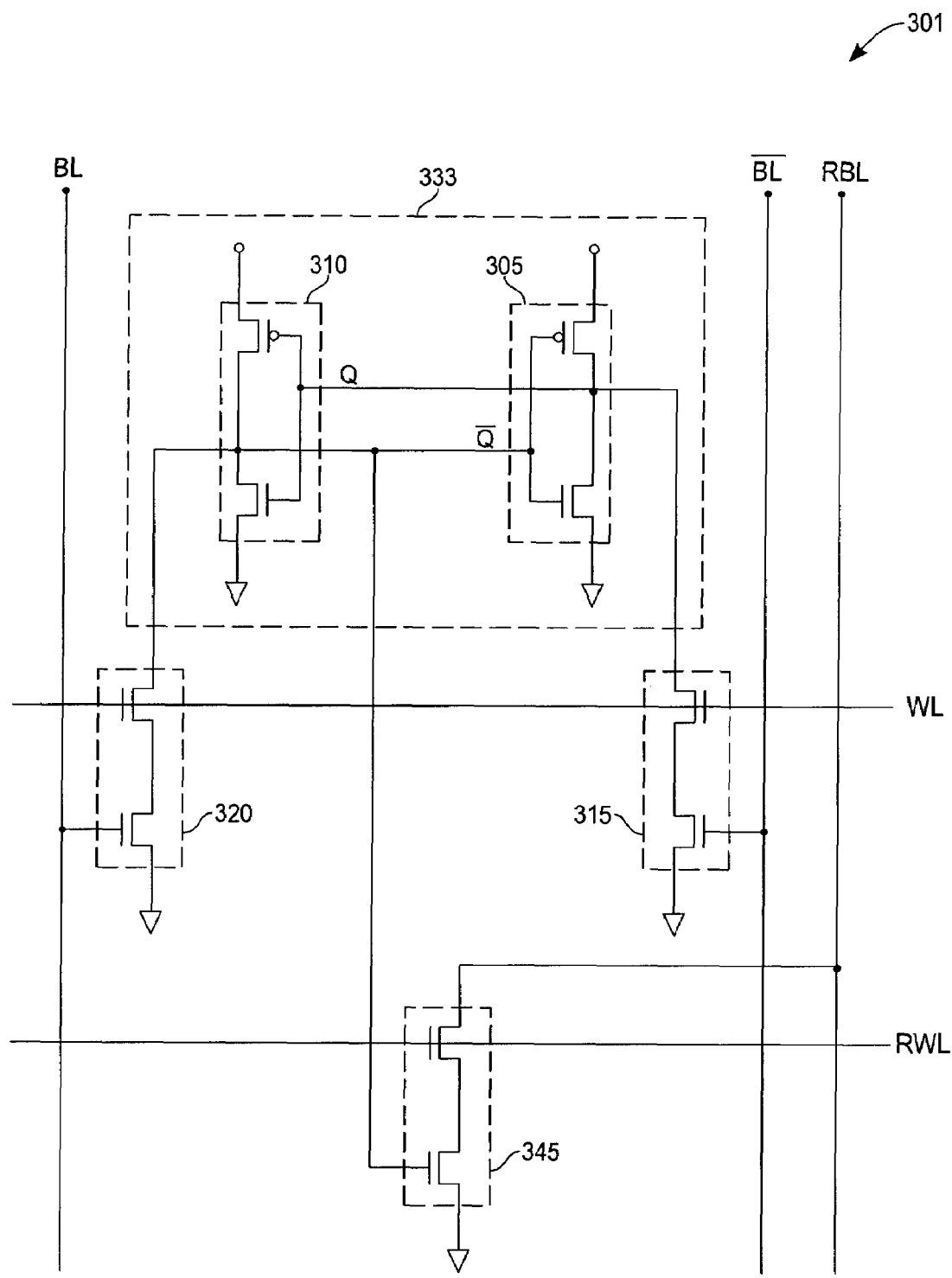
FIG. 3A is an exemplary schematic diagram of a static memory cell of the present invention.

With reference to FIG. 3A, a first CMOS inverter 305 is cross-coupled with a second CMOS inverter 310 in an exemplary schematic diagram of a static memory cell 301. The first and second CMOS inverters 305, 310 form a memory cell latch loop 333 of a static RAM cell. A first output of the memory cell latch loop Q and a second output of the memory cell latch loop $\overline{Q}$ are formed by the outputs of the first and second CMOS inverters 305, 310 respectively. The first output of the memory cell latch loop Q connects to an output drain of a first two-transistor stack 315. The second output of the memory cell latch loop $\overline{Q}$ connects to an output drain of a second two-transistor stack 320. The second output of the memory cell latch loop $\overline{Q}$ also connects to a data input of a third two-transistor stack 345. The first, second, and third two-transistor stacks 315, 320, 345 are shown, for example, as a series connection of NMOS transistors with common source-drain diffusion and conductive channels in series.

A wordline WL connects to a control input of each of the first and second two-transistor stacks 315, 320. The first and second to transistor stack 315, 320 are connected to a pair of bitlines. A first bitline BL connects to a data input of the second two-transistor stack 320. A second bitline $\overline{BL}$ connects to a data input of the first two-transistor stack 315. A read bitline RBL connects to an output drain of the third two-transistor stack 345 to form a read port. A read wordline RWL connects to a first control input of the third two-transistor stack 345.

Figure 1A:
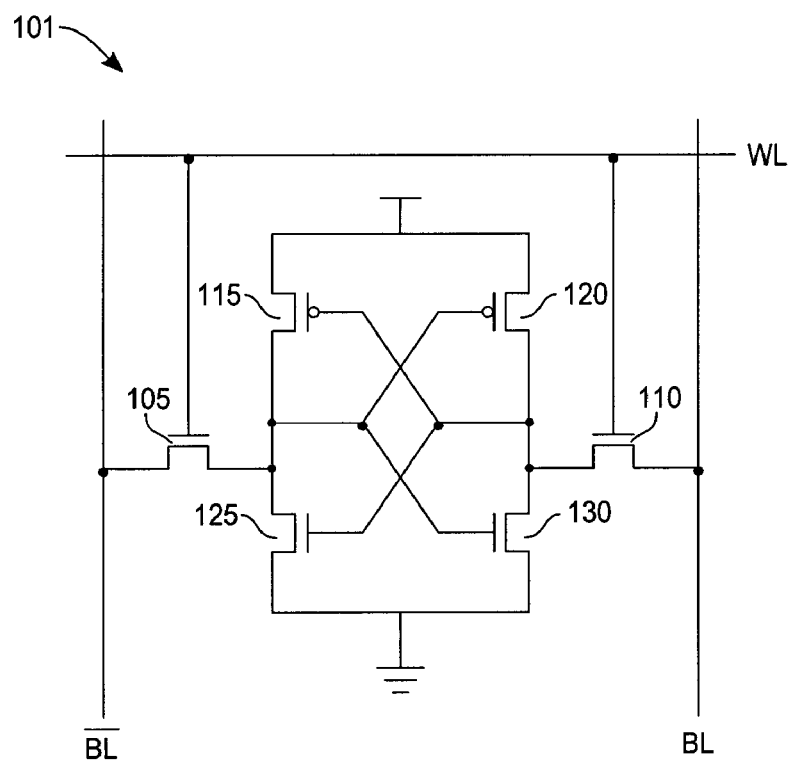
FIG. 1A is a schematic diagram of a prior art six transistor static memory cell.
Figure 1B:
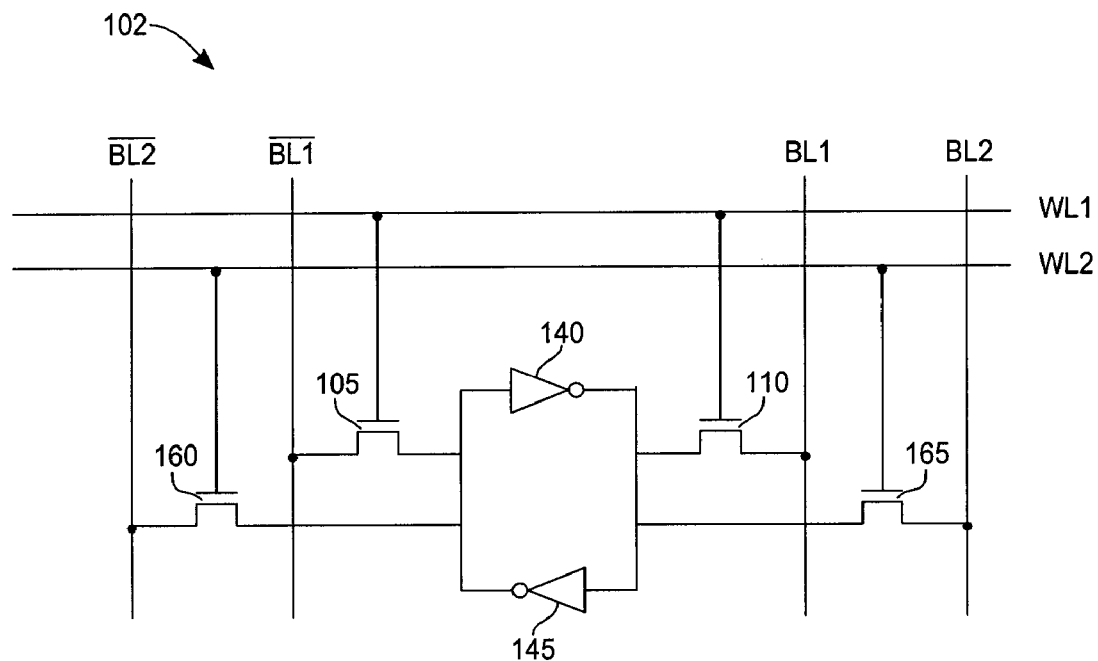
FIG. 1B is a schematic diagram of a prior art six transistor static memory cell with dual-port access.
Figure 1C:
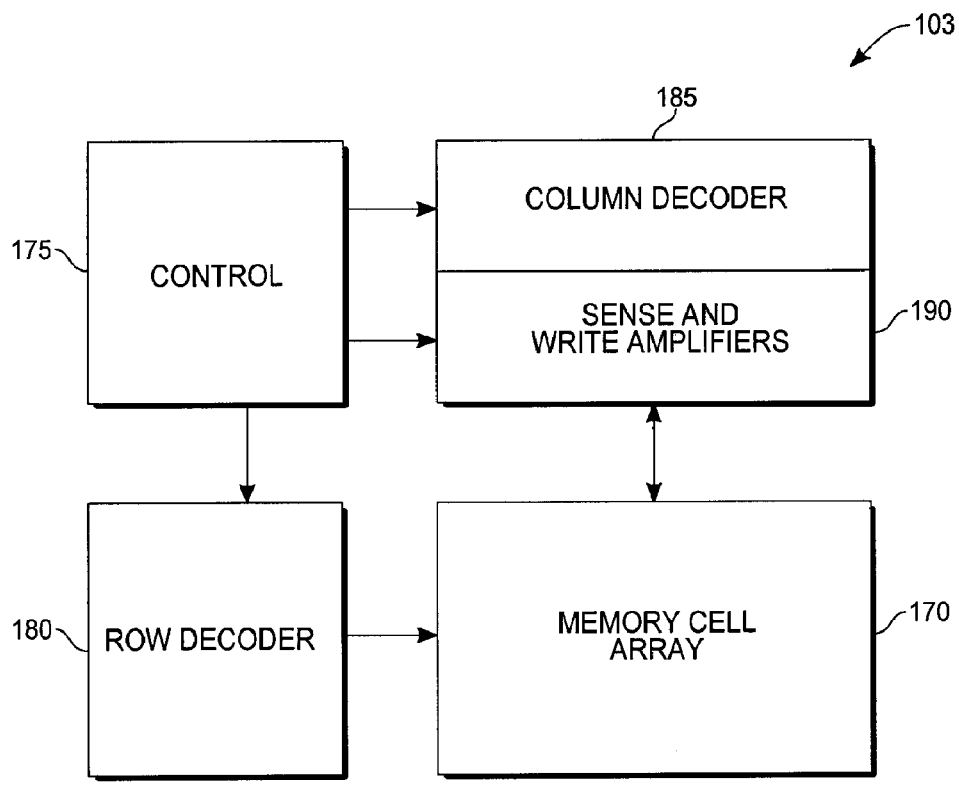
FIG. 1C is a diagram of a prior art memory system with a memory cell array consisting of cells such as the six transistor static memory cell of FIG. 1A.
Figure 2:
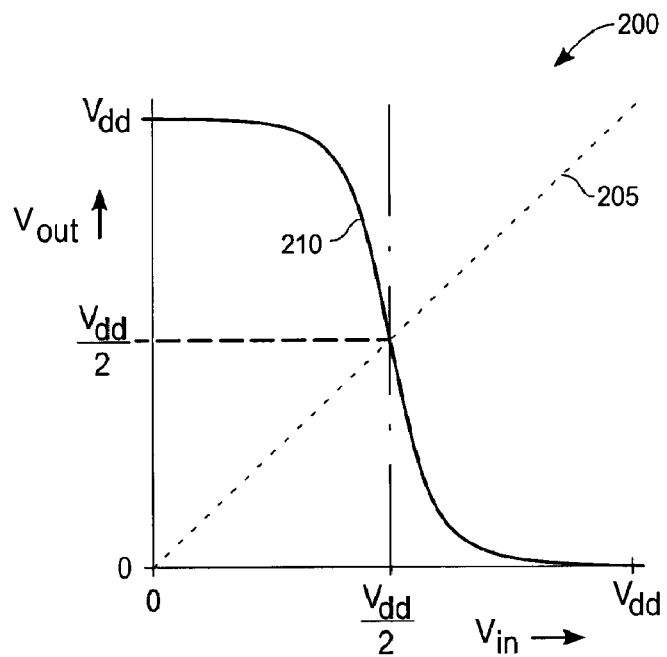
FIG. 2 is a diagram of a transfer curve of a prior art CMOS inverter.

In another embodiment (not shown) the read port formed by the third two-transistor stack 345 may be used with a cell array incorporating a standard write port as in FIG. 1A. The third two-transistor stack 345, as described supra, is connected to $\overline{Q}$ and a read wordline RWL and drives a read bitline RBL.

Figure 3B:
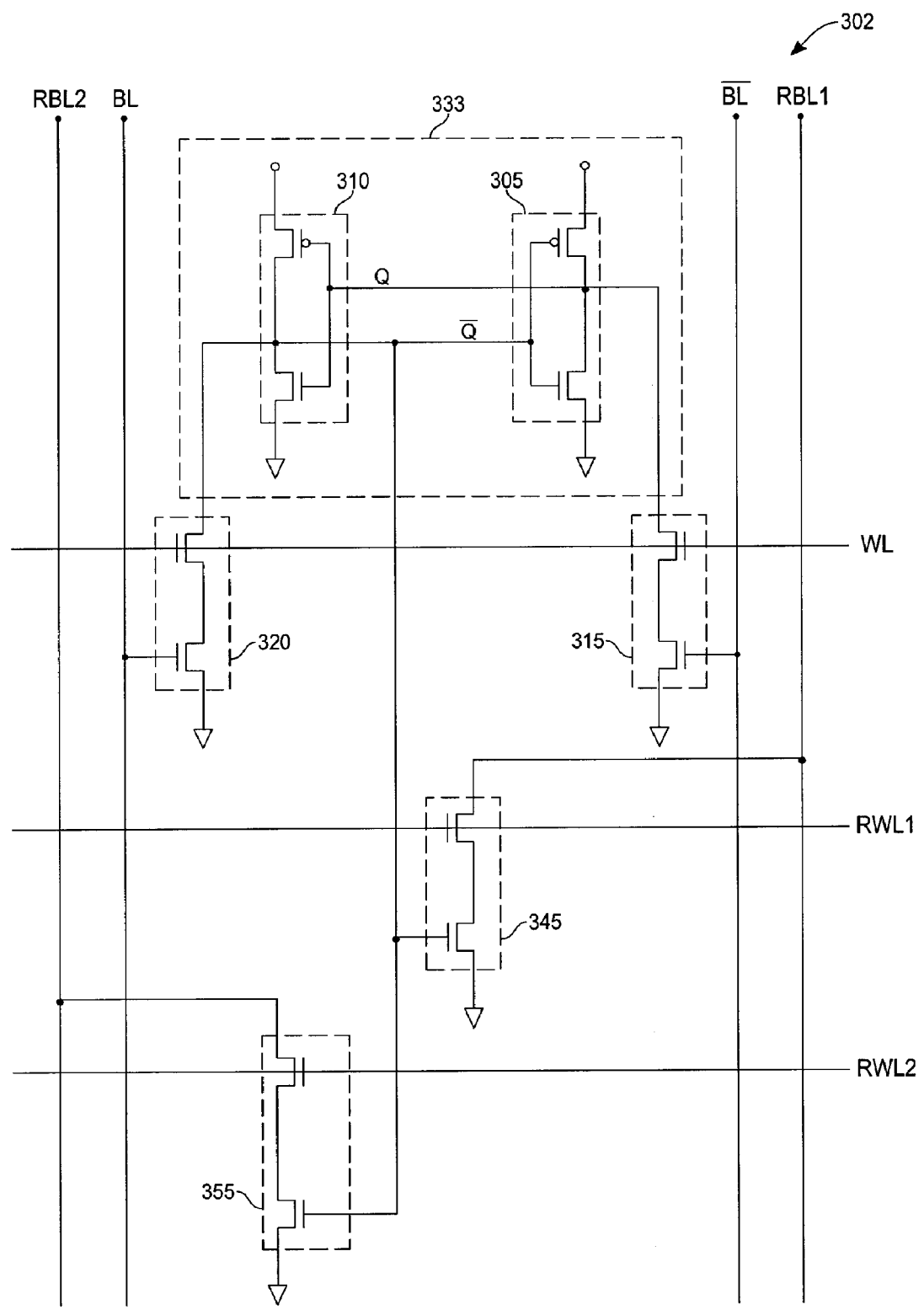
FIG. 3B is an exemplary schematic diagram of a static memory cell with dual port read access of the present invention.

With reference to FIG. 3B, the second output of the memory cell latch loop $\overline{Q}$ also connects to a data input of a third and a fourth two-transistor stack 345, 355 in an exemplary schematic diagram of a dual port static memory cell 302. The third and fourth two-transistor stacks 345, 355 are shown, for example, as a series connection of NMOS transistors with a common source-drain diffusion and conductive channels in series.

A first read bitline RBL1 connects to an output drain of the third two-transistor stack 345 to form a first read port. A second read bitline RBL2 connects to an output drain of the fourth two-transistor stack 355 to form a second read port. A first read wordline RWL1 connects to a control input of the third two-transistor stack 345. A second read wordline RWL2 connects to a control input of the fourth two-transistor stack 355.

Figure 4A:
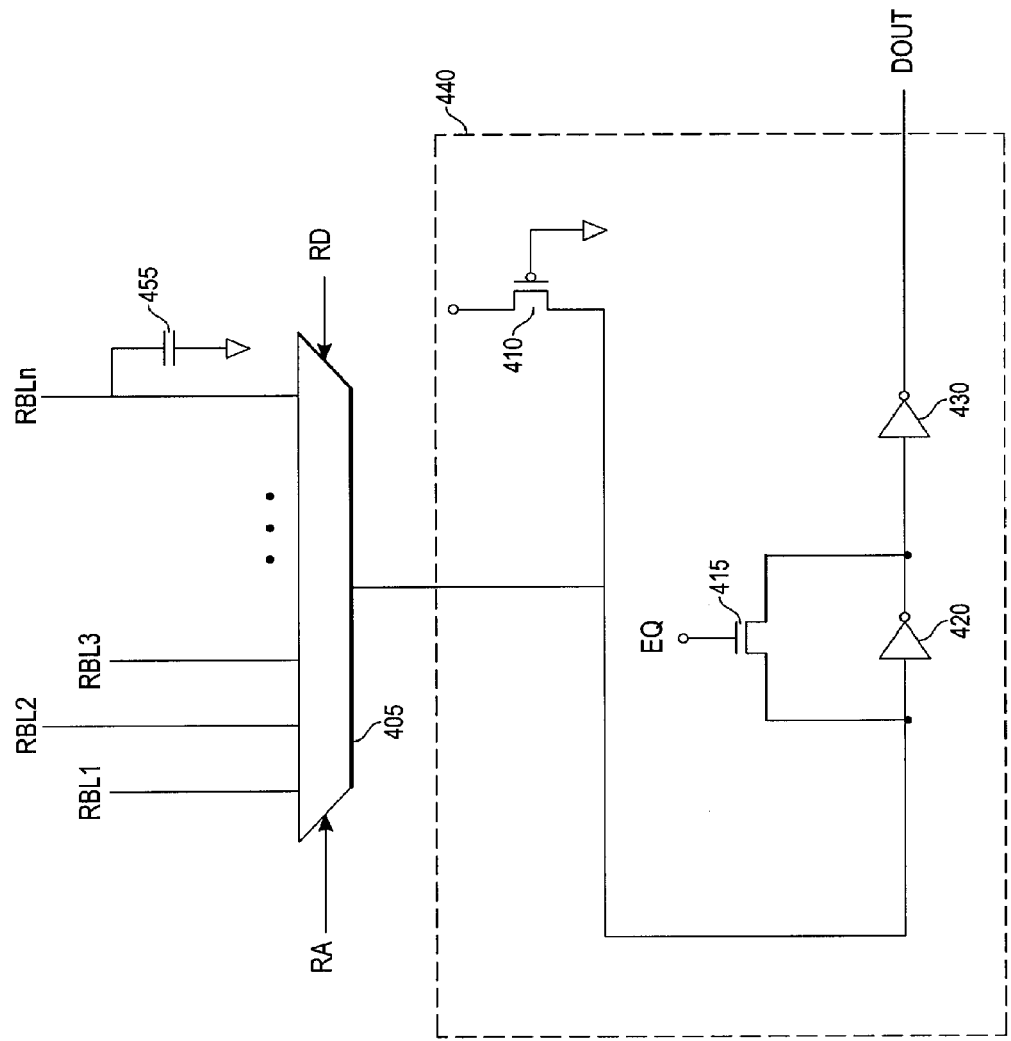
FIG. 4A is an exemplary block diagram of a sense amplifier of the present invention.

With reference to FIG. 4A, an output of a read bitline multiplexer 405 connects to an exemplary sense amplifier 440. An input to the sense amplifier 440 connects to an output drain of a pull-up device 410 and an input of a first inverter 420. The pull-up device 410 connects to a $V_{DD}$ level and is biased at a control input to be continually in a pull-up state. The pull-up device 410 may be, for example, constructed from a PMOS transistor with a source node connected to $V_{DD}$, a drain connected to the input to the sense amplifier 440, and a control input connected to ground. An output of the first inverter 420 connects to an input of a second inverter 430 and an input of a feedback device 415. An output of the feedback device 415 connects to the input of the first inverter 420. Due to the symmetrical nature of the current conduction through the feedback device 415 and the input of the first inverter 420, the first stage of the sense amplifier 440 is a transimpedance amplifier. An equalization signal is connected to a control input EQ of the feedback device 415. An output of the second inverter 430 connects to a data output DOUT. The equalization signal is lowered to turn off the control input EQ to the feedback device in the exemplary embodiment in order to reduce power consumption. However, in another embodiment, the EQ may instead be tied to $V_{DD}$ continually, for example, for faster access times. The sense amplifier 440 will still sense while the feedback device 415 is enabled. The transfer characteristics of the first inverter 420 and the second inverter 430 may be closely matched through analog layout techniques to reduce offset. Analog layout techniques to reduce the offset are well-known to ones of skill in the art.

A plurality of read bitlines (RBL1, RBL2, RBL3, . . . , RBLn) connect to respective bitline inputs of the read bitline multiplexer 405. A read address input RA of the read bitline multiplexer 405 receives an address of one of the read bitlines (RBL1, RBL2, RBL3, . . . , RBLn) connected to a memory cell to be read. A read enable input RD receives a read enable signal to control read operations. An exemplary total read bitline loading capacitance is represented by a read bitline loading capacitor 455 connected, for example, to a highest order bitline RBLn.

The exemplary embodiment of the present invention of FIG. 4A also includes an exemplary sense amplifier 440 with an intrinsic precharge capability. The sense amplifier 440 incorporates a feedback device 415 across the first inverter 420 that causes the input to the sense amplifier 440 to seek a quiescent voltage level at about a midpoint between $V_{DD}$ and ground (i.e., $$V_{in} \cong \frac{V_{DD}}{2}\bigg).$$

The sense amplifier 440 is a two-stage non-inverting buffer. A cascading of two inverting buffer stages 420, 430 produces a high gain and a short read access time. The short read access time allows a concurrent write to the same memory cell array in a single clock cycle system.

Figure 4B:
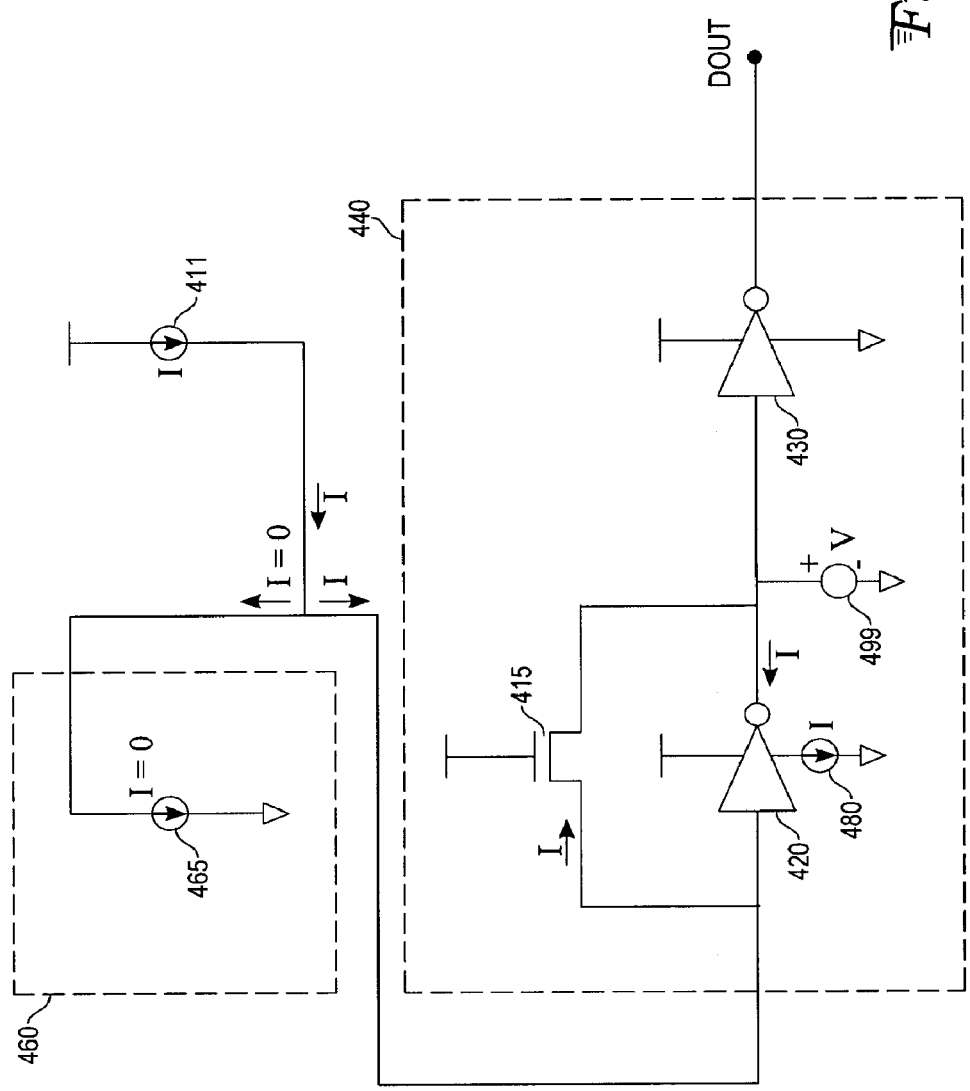
FIG. 4B is an equivalent circuit current flow diagram for the sense amplifier of FIG. 4A detecting a one as a data content in a read operation of a static memory cell of FIG. 3A.

With reference to FIG. 4B, a data content of a selected cell 460 is a one ("1"). The pulldown stack 345 (FIG. 3A) connected to the read bitline RBL receives a low logic level signal from the $\overline{Q}$ output of the memory cell latch loop 333. The read port formed by the pulldown stack 345 is off and therefore not sinking any current through the equivalent pull down current source 465 (i.e., zero current or I=0). The pullup device 410 (FIG. 4A) provides a constant source current of value I represented by an equivalent pullup device current source 411. The current I from the equivalent pullup device current source 411 flows into the sense amplifier 440 input. With the feedback device 415 enabled by the input control gate connected continuously, for example, to a high voltage level supply, the current I flows into the feedback device 415 and into the output of the first inverter 420. A first equivalent current source 480 indicates the current I, which entered through the output of the first inverter 420, flowing to ground. To provide an aid in understanding, a hypothetical (i.e., not actually a part of the sense amplifier 440 circuit) voltage potential measurement device 499 monitors the output of the first inverter 420 and indicates an output potential is below the input potential of the first inverter 420 (i.e., $V_{out} < V_{in}$). The difference in potential from output to input at the first inverter 420 is due to the equivalent current source of the pull up device 411 producing current through the (resistive) feedback device 415 and causing a voltage drop from input to output ($V_{in} - V_{out}$ is positive) across the inverter 420. The relatively low voltage output from the first inverter 420 feeds into the second inverter 430 and produces a high level output at a DOUT node indicating the data content of the selected cell 460 is one.

Figure 4C:
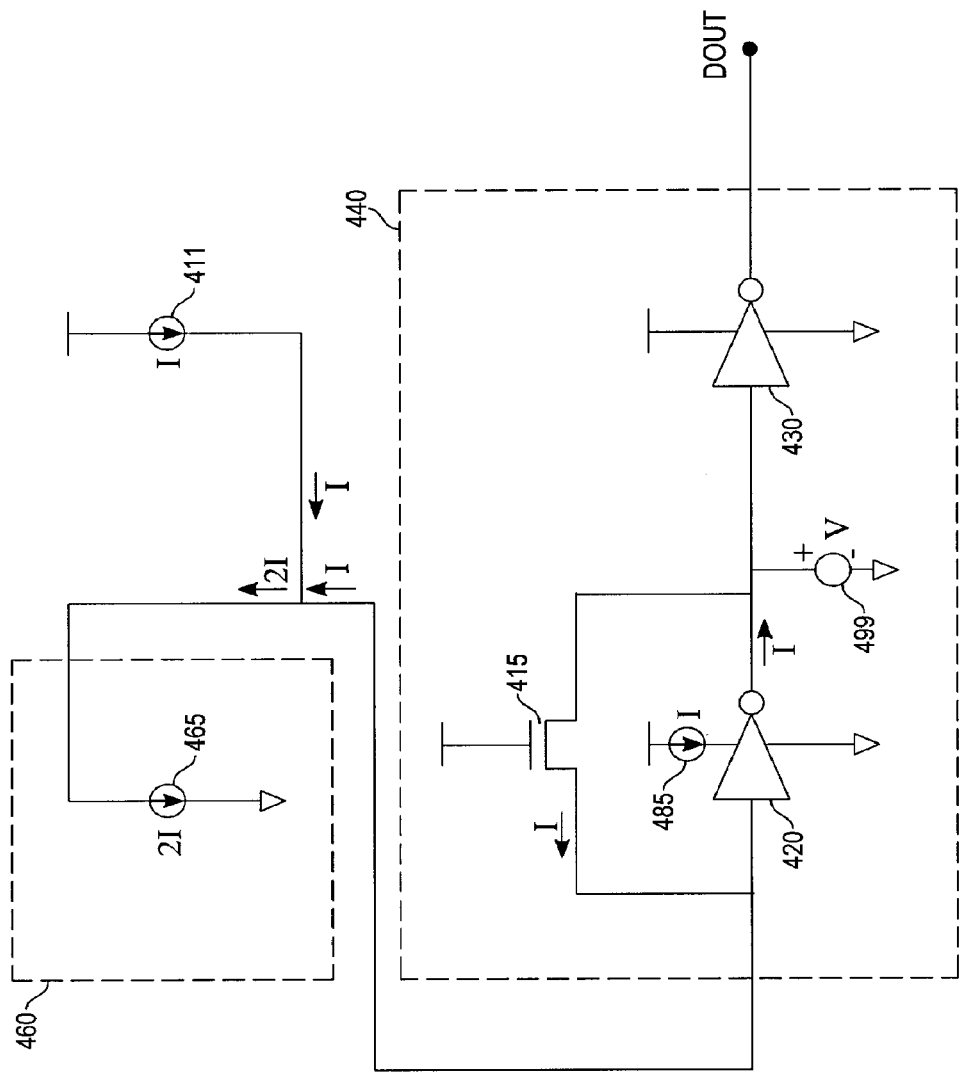
FIG. 4C is an equivalent circuit current flow diagram for the sense amplifier of FIG. 4A detecting a zero as a data content in a read operation of a static memory cell of FIG. 3A.

With reference to FIG. 4C, a data content of a selected cell 460 is a zero ("0"). The pulldown stack 345 (FIG. 3A) connected to the read bitline RBL receives a high logic level signal from the $\overline{Q}$ output of the memory cell latch loop 333. The read port formed by the two transistor stack 345 is on and conducting a current 2I represented by the equivalent pull down current source 465. The pullup device 410 (FIG. 4A) provides a constant source current of value I represented by an equivalent pullup device current source 411. The current I from the equivalent pullup device current source 411 flows into the output of the read port pulldown stack 345 of the selected cell 460. With the feedback device 415 enabled by the input control gate connected continuously, for example, to a high voltage level supply, a current I flows out of the output of the first inverter 420 and into the feedback device 415. A second equivalent current source 485 indicates the current I entering the first inverter 420 at a high level supply voltage node. To provide an aid in understanding, a hypothetical (i.e., not actually a part of the sense amplifier 440 circuit) voltage potential measurement device 499 monitors the output of the first inverter 420 and indicates an output potential of the first inverter 420 above the input potential. The elevated output potential of the first inverter 420 is due to the current sourced at the output producing current through the (resistive) feedback device 415 and causing a voltage drop from output to input ($V_{in} - V_{out}$ is negative) across the inverter 420. The relatively high voltage output from the first inverter 420 feeds into the second inverter 430 and produces a low level output at a DOUT node indicating the zero data content of the selected cell 460. Therefore, the sense amplifier 440 is a transimpedance amplifier sensing the direction of the current flow at an input to the sense amplifier 440.

Figure 5:
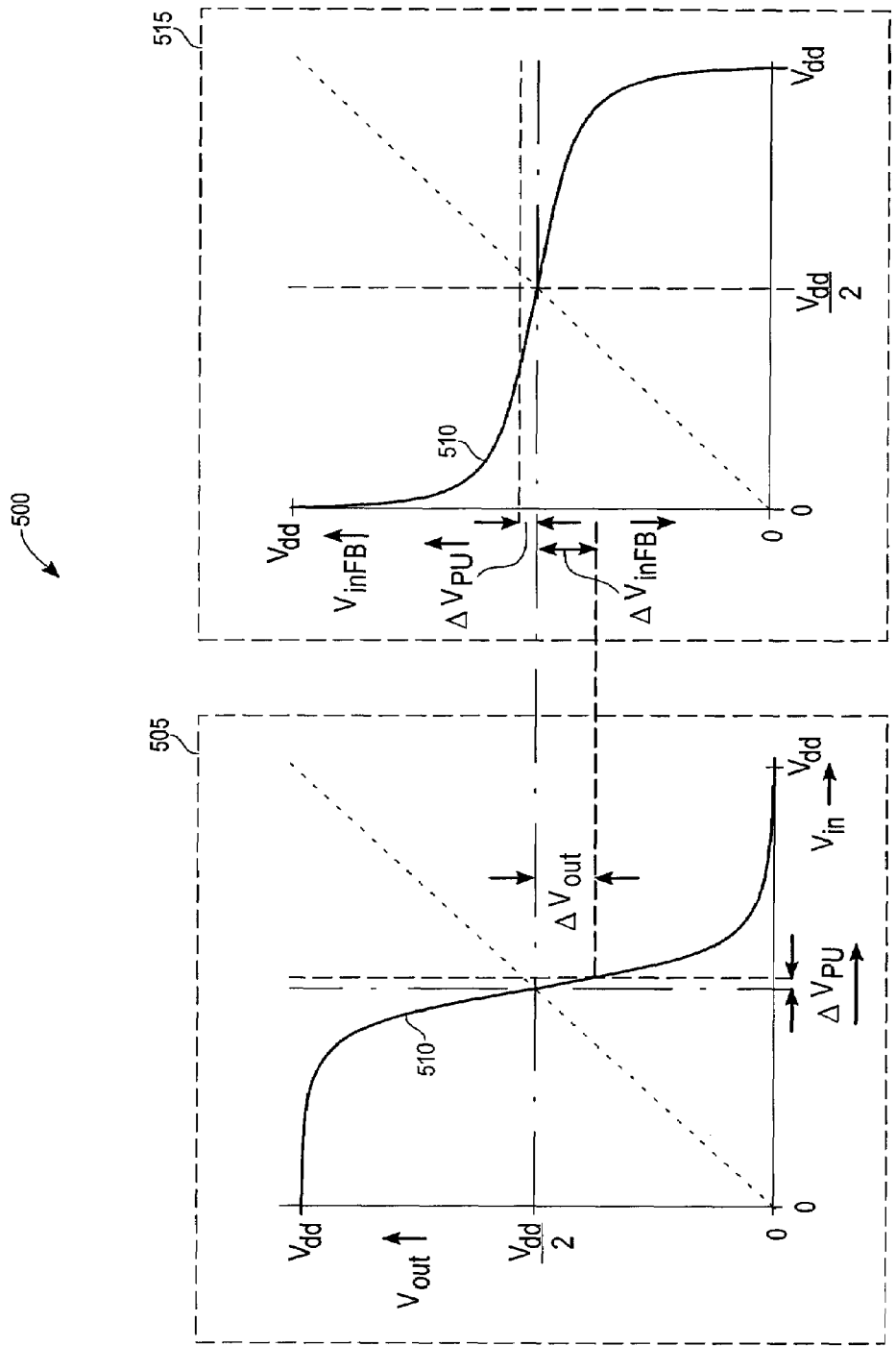
FIG. 5 is a conceptual diagram of feedback behavior in a first stage of the sense amplifier of FIG. 4A.

With reference to FIG. 5, a first inverter transfer characteristic 505 is cascaded with a second inverter transfer characteristic 515 in a conceptual feedback diagram 500 of feedback behavior in the first stage of the sense amplifier 440 of FIG. 4A. In the first stage of the sense amplifier 440, the output of the first inverter 420 connects to a feedback device 415. The output of the feedback device 415 connects to the input of the first inverter 420. A graphical depiction of the feedback characteristic is formed by a cascading of two instances of the inverter transfer characteristic 505, 515.

A generic inverter transfer curve 510 crosses an equal potential line at about $$\frac{V_{DD}}{2}$$

in the first inverter transfer characteristic 505. The second inverter transfer characteristic 515 is the same generic inverter transfer curve 510 of the first inverter transfer characteristic 505 rotated 90° clockwise and flipped vertically. An output signal of the first inverter 420 (FIG. 4A) becomes an input signal to the first inverter 420 after passing through the feedback device 415. Viewed graphically, the $V_{out}$ axis of the first inverter transfer characteristic 505 is aligned with an input axis of the second inverter transfer characteristic 515 which is labeled $V_{inFB}$ for clarity with increasing potential depicted upward.

A change in input voltage to the sense amplifier 440 due to the pullup device 410 is labeled $\Delta V_{PU}$. The change in output voltage of the first stage is labeled $\Delta V_{out}$ and ranges downward along the $V_{out}$ axis due to the inverting nature of the first stage. The corresponding new input to the first inverter 420 coming from the feedback device 415 is $\Delta V_{inFB}$ which also ranges downward. The magnitude of $\Delta V_{inFB}$ is much greater than that of $\Delta V_{PU}$ due to the gain of the first stage. The downward ranging potential of $\Delta V_{inFB}$ in the second inverter transfer characteristic 515 is opposite to the upward (for the axis as drawn) ranging of $\Delta V_{PU}$ and is of greater magnitude. $\Delta V_{inFB}$ thus cancels the tendency to increase potential at the sense amplifier 440 input caused by the pull up device 410. The amount of gain in the first stage is also an indicator of the strength of the precharge capability of the sense amplifier 440.

Figure 6:
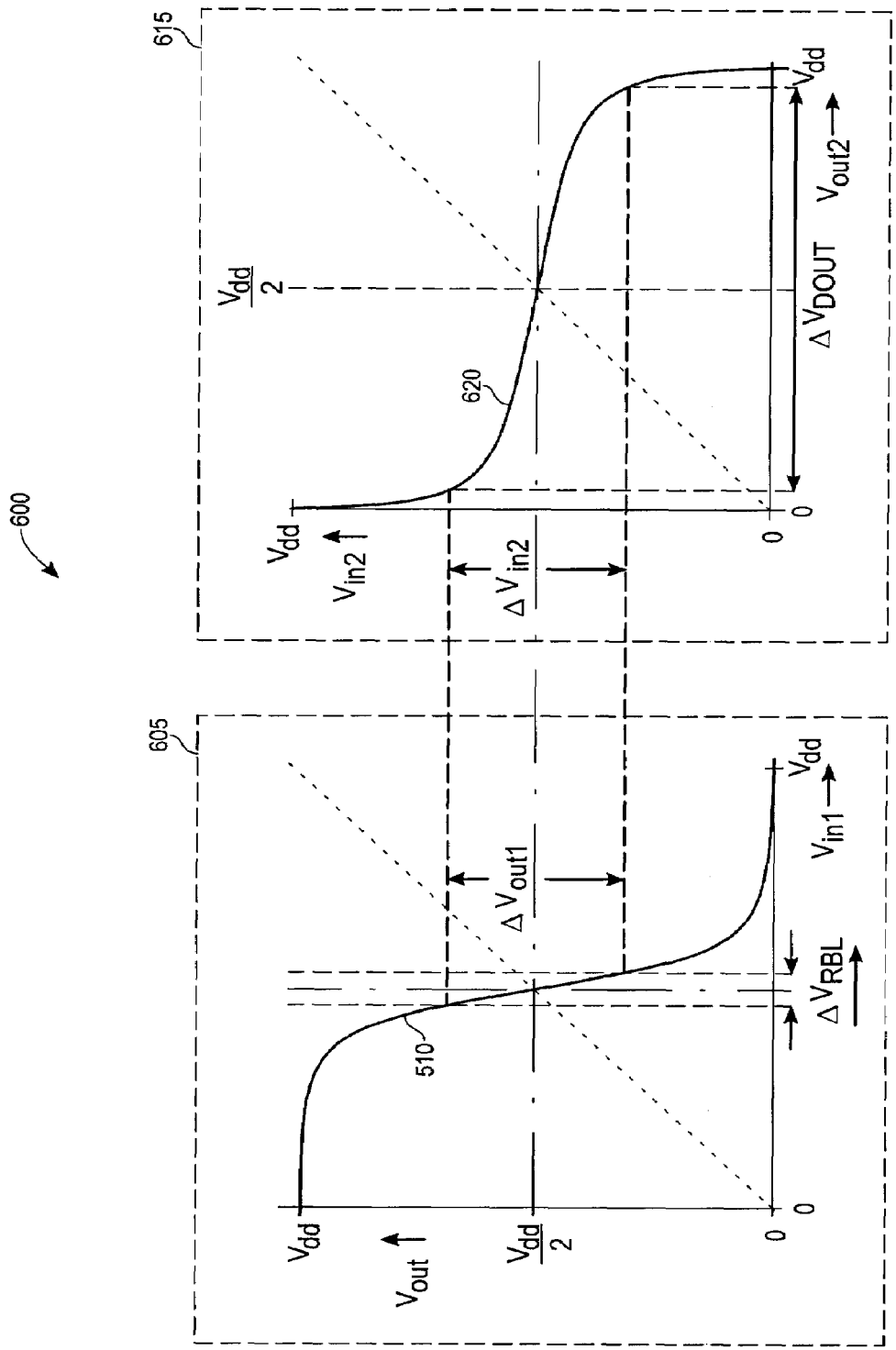
FIG. 6 is an amplification characteristic diagram corresponding to a sequence of inverters in the sense amplifier of FIG. 4A.

With reference to FIG. 6 a first inverter transfer characteristic 605 is cascaded with a second inverter transfer characteristic 615 in an amplification characteristic diagram 600 corresponding to the sense amplifier 440 of FIG. 4A. The first inverter transfer curve 510 (repeated from FIG. 5) crosses an equal potential line at approximately $$\frac{V_{DD}}{2}.$$

A read bitline signal range $\Delta V_{RBL}$ along the abscissa of the first inverter transfer characteristic 605 corresponds to a large first inverter signal output $\Delta V_{out1}$. A second inverter transfer curve 620 crosses an equal potential line at approximately $$\frac{V_{DD}}{2}.$$

The first inverter transfer curve 510 and the second inverter transfer curve 620 are matched by noting the physical layout design rules used in the fabrication of the first and second inverters 420, 430.

The first inverter signal output $\Delta V_{out1}$ is the second inverter input signal $\Delta V_{in2}$ and the ordinate of the second inverter transfer characteristic 615. An amplification characteristic of the second inverter 430 is indicated as a sense amplifier signal output $\Delta V_{DOUT}$ along the abscissa of the second inverter transfer characteristic 615. A relatively small magnitude of read bitline signal range $\Delta V_{RBL}$ may produce a variation in the sense amplifier signal output $\Delta V_{DOUT}$ spanning a nearly rail-to-rail range in potential.

Figure 7:
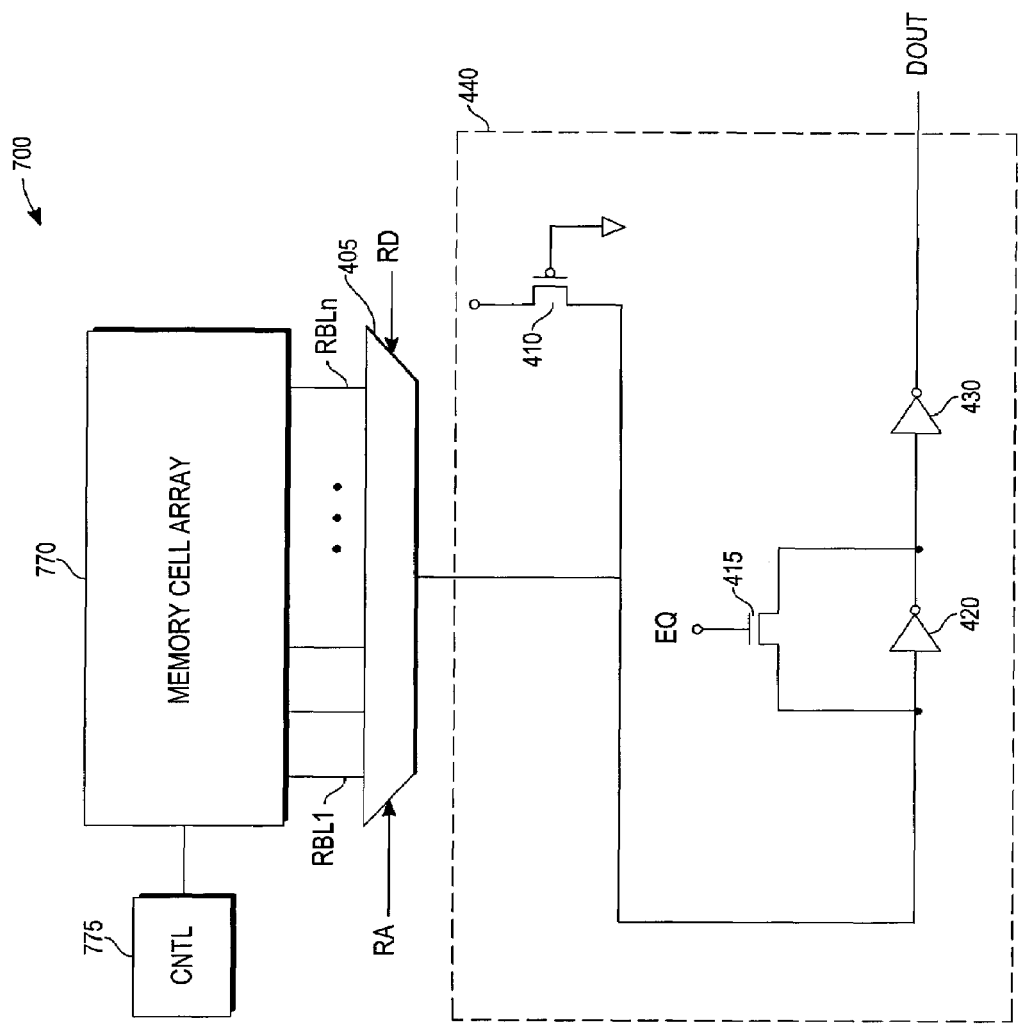
FIG. 7 is an exemplary system block diagram of the present invention incorporating a memory array, a multiplexer, and a sense amplifier.

With reference to FIG. 7 a memory cell array 770 connects to a sense amplifier 440 through a read bitline multiplexer 405 in an exemplary memory system block diagram 700. A read address is provided to the read bitline multiplexer 405 at a read address input RA. The read address provided is used by the read bitline multiplexer 405 to select a single one of the read bitlines (RBL1, ..., RBLn). When a read enable signal RD_EN is received by the read bitline multiplexer 405, a single one of the read bitlines (RBL1, ..., RBLn) will be selected and an electrical path provided to the output of the read bitline multiplexer 405. The output of the read bitline multiplexer 405 connects to the input of the sense amplifier 440 (FIG. 4A). A controller 775 connects to the memory cell array 770 to provide control signals for wordline and read wordline selection.

Figure 8:
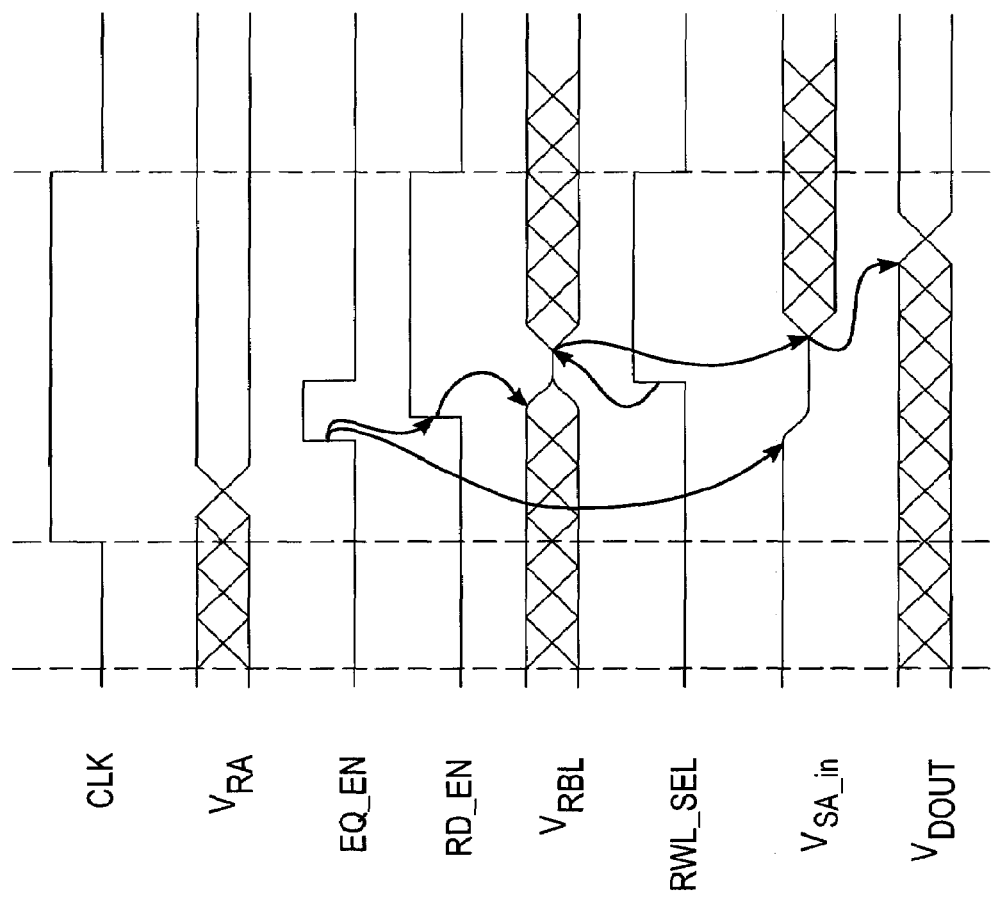
FIG. 8 is a logic timing diagram for a read bitline precharge and read cycle of the sense amplifier of FIG. 4A.

With reference to FIG. 8, a read address $V_{RA}$ is received just after a rising transition of a clock signal CLK in an exemplary logic timing diagram of the memory system of FIG. 7. An equalizing precharge enable signal EQ_EN is applied at the control signal input EQ of the sense amplifier 440 (FIG. 4A) as a standard component of a typical read cycle. The precharge enable signal EQ_EN activates the feedback device 415 within the sense amplifier 440 electrically coupling the input and output of the first inverter 420. The sense amplifier input voltage $V_{SA\_in}$ is held at a high voltage level by the pullup device 410 until the feedback device 415 is activated. With the feedback device 415 activated, the sense amplifier input voltage $V_{SA\_in}$ transitions from the high voltage level to a precharge voltage potential approximately halfway between the supply voltage level and ground. The precharge transition takes place as the first inverter 420 tries to maintain an inverter operating condition with $V_{OUT}=V_{IN}$, as explained supra, due to the conductive path through the feedback device 415.

A read enable signal RD_EN applied to the read enable input RD of the read bitline multiplexer 405 (FIG. 4A), provides a conductive path between a selected read bitline (RBL1, RBL2, ..., RBLn) and the sense amplifier 440. With application of the read enable signal RD_EN, the read bitline voltage $V_{RBL}$ will transition to the precharge voltage level produced at the input to the sense amplifier 440. The read bitline voltage $V_{RBL}$, therefore, also assumes a voltage potential approximately halfway between the supply voltage level and ground. As the precharge voltage level is attained the sense amplifier 440 is prepared to read a memory cell along the memory cell column associated with the selected read bitline (RBL1, RBL2, ..., RBLn). The feedback device enables the sense amplifier 440 first stage sensing circuit to also precharge a selected read bitline. A read port for one or more memory cells is accessed with a select signal applied to a read wordline RWL (FIG. 3A). A single one of the read bitlines (RBL1, ..., RBLn) is selected when a read address is applied to a read address input RA of the read bitline multiplexer 405. A single read path from a memory cell to the sense amplifier 440 is enabled by the application of the read wordline select signal RWL_SEL to the read wordline RWL and the read address $V_{RA}$ applied to the read bitline multiplexer 405. The sense amplifier 440 precharges the selected one of the read bitlines (RBL1, ..., RBLn) to a level of approximately Only the selected read bitline (RBL1, ..., RBLn) is precharged, thereby eliminating wasted charge on the non-selected read bitlines (RBL1, ..., RBLn) and reducing power consumption.

The controller 775 (FIG. 7) uses the read address $V_{RA}$ to determine a selection of a read wordline RWL (FIG. 3A). A read wordline select signal RWL_SEL is generated by the controller 775 and applied to the memory cell array 770. The read wordline select signal RWL_SEL is applied to the selected read wordline RWL and is input to the two-transistor stack 345 read port. The read port output of the selected memory cell connects to the read bitline RBL. The read port will pull the read bitline RBL low producing a low level read bitline signal $V_{RBL}$, if a zero is stored in the selected cell or will maintain an open or electrical tristate condition relative to the read bitline RBL when the contents of the selected cell is a one. A high level read bitline signal $V_{RBL}$ is produced due to the pull up device 410 when the data content of the selected cell is a one.

The conductive path through the read bitline multiplexer 405 (FIG. 4A) between the sense amplifier 440 and a read bitline RBL means that the sense amplifier input voltage $V_{SA\_in}$ will follow the read bitline signal $V_{RBL}$. The first inverter 420 and second invert 430 connect in series within the sense amplifier 440 and produce a data output signal $V_{DOUT}$ that follows the sense amplifier input voltage $V_{SA\_in}$. The data output signal $V_{DOUT}$ is produced at the data output node DOUT after a propagation delay through the first and second inverters 420, 430.

The present invention has numerous additional advantages over the prior art as will be recognized by one skilled in the art. In the present invention the read port formed by a pulldown transistor stack connects to the memory cell latch loop with a small single device input loading. The read port electrical connection, compared to the prior art, is continuous and therefore not disruptive of data contents of a memory cell due to electrical switching. The continuous connection feature of the present invention contrasts with access devices formed by field effect transistors in a transmission gate configuration of the prior art. In the prior art, a transmission gate type connection causes a substantial change in capacitance coupled to a memory cell during switching. Therefore, management of voltage potentials on bitlines connected by transmission gate access devices is critical in the prior art to avoid upset of the data contents of the cell. Stringent precharge schemes result from bitline voltage management requirements in the prior art. A read port of the present invention avoids such a criticality.

Additionally, the read port electrical connection of the present invention, being a single device connection, is referred to as a single-ended read port. Contrasting schemes of the prior art incorporate differential read ports requiring two devices to connect electrically with the memory cell latch loop, a second read bitline, and a pulldown and a pullup stack of transistors. Conventional differential read ports require substantially more area for the memory cell array compared to a memory cell array constructed with single-ended read ports of the present invention.

A memory cell reading scheme of the present invention will select and precharge only a single read bitline at a time. Single bitline precharging reduces the amount of power consumed per cycle of a read operation significantly over prior art approaches that precharge read bitlines in bulk. The present invention also precharges selected single read bitlines to a voltage potential about halfway between the voltage supply level and ground. The approximate precharge voltage level of $V_{DD}/2$ reduces the amount of time and power required to complete a precharge phase of a read operation. The amount of time and power saved contrasts to prior art schemes requiring precharging to a full or nearly full supply voltage level. The contrast is even greater for a conventional scheme requiring precharging to a full supply voltage level for differential read bitlines and for all read bitline pairs.

The sense amplifier and precharge circuitry of the present invention minimize power expenditure in read operations by precharging only a single read bitline to a $$\frac{V_{DD}}{2}$$

level. The voltage feedback means for accomplishing the precharge level is concise; requiring neither additional self-timed circuitry, additional specialized control circuitry, nor control signal routing. A read port by the present invention utilizes single ended circuitry with low loading of a memory cell latch loop during reading. The single ended approach saves area and is much less likely to perturb stored data levels during read operations compared with conventional read circuitry based on transmission gate connectivity.

Although the present invention has been described generally in terms of specific embodiments, a person of skill in the art will realize that certain circuit elements may also be realized with alternate approaches. For instance, a buffer means, although shown as a CMOS inverter, may also be implemented as an operational amplifier. Even though a feedback means has been depicted as an NMOS FET with a gate tied to a high-level control voltage, one skilled in the art would readily understand that a PMOS FET with a control gate tied to a low-level control voltage or a junction field effect transistor would also accomplish the same result. While a pullup means has been presented as a PMOS FET with a gate connected to ground potential, a person skilled in the art would readily envision a pull-up means fabricated from a resistor to attain a similar result. While a writing means has been depicted as an NMOS transmission gate, one skilled in the art would readily conceive of a PMOS transmission gate providing equivalent capability.

What is claimed is:

1. A memory system comprising:
    a plurality of memory cells, at least select ones of the plurality of memory cells configured to be accessible by a read port and a pair of write ports, the select ones of the plurality of memory cells further configured to allow simultaneous reading and writing of the memory cells; and
    a row decoder coupled to the read ports and the pairs of write ports, wherein the row decoder is configured to receive a storage location address and couple a subset of pairs of write ports and a subset of read ports to respective bitline pairs and respective read bitlines corresponding to the storage location address.

2. The memory system of claim 1 wherein the plurality of memory cells is organized by rows and columns.

3. The memory system of claim 1 further comprising a column decoder coupled to the pairs of write ports in the select ones of the plurality of memory cells and configured to access a subset of the pairs of write ports in a single column of the memory cells at a time in a memory cell write operation.

4. The memory system of claim 1 further comprising a read bitline multiplexer coupled to the read ports of the select ones of the plurality of memory cells and configured to select a subset of the read ports corresponding to a single column of memory cells at a time in a memory cell read operation.

5. The memory system of claim 4 further comprising a sense amplifier coupled to the read bitline multiplexer and configured to read a data content from a selected memory cell.

6. The memory system of claim 5 wherein the sense amplifier is further configured to precharge a single one of a plurality of read bitlines at a time in a read operation.

7. The memory system of claim 1 further comprising a control block configured to produce control signals in read and write operations.

8. A memory system comprising:
a plurality of memory cells, at least select ones of the plurality of memory cells configured to be accessible by a read port and a pair of write ports, the select ones of the plurality of memory cells configured to allow simultaneous reading and writing of the memory cells;
a row decoder coupled to read ports and pairs of write ports; and
a transconducting device coupled to the plurality of memory cells and configured to toggle a select one of the plurality of memory cells to have a desired data content and requiring no precharge of a bitline coupled to the plurality of memory cells.

9. The memory system of claim 8 wherein the transconducting device is coupled to the plurality of memory cells through a memory latch loop.

10. The memory system of claim 8 wherein the row decoder is configured to receive a storage location address and couple a subset of the pairs of write ports and a subset of the read ports to respective bitline pairs and respective read bitlines corresponding to the storage location address.

11. The memory system of claim 8 further comprising a column decoder coupled to the pairs of write ports in the select ones of the plurality of memory cells and configured to access a subset of the pairs of write ports in a single column of the memory cells at a time in a memory cell write operation.

12. The memory system of claim 8 further comprising a read bitline multiplexer coupled to the read ports of the select ones of the plurality of memory cells and configured to select a subset of the read ports corresponding to a single column of memory cells at a time in a memory cell read operation.

13. The memory system of claim 12 further comprising a sense amplifier coupled to the read bitline multiplexer and configured to read a content of a selected memory cell.

14. The memory system of claim 8 further comprising a control block configured to produce control signals in read and write operations.

15. A memory system comprising:
a memory cell array arranged as a matrix of memory cells organized by rows and columns with the memory cells configured to be accessible by a pair of write ports and a read port;
a row decoder coupled to pairs of write ports and read ports and configured to receive a storage location address and couple a subset of the pairs of write ports and a subset of the read ports to respective bitline pairs and respective read bitlines corresponding to the storage location address;
a column decoder coupled to the pairs of write ports in the memory cell array and configured to access a subset of the pairs of write ports in a single column of memory cells at a time in a memory cell write operation; and
a read bitline multiplexer coupled to the read ports of the memory cell array and configured to select a subset of the read ports corresponding to a single column of memory cells at a time in a memory cell read operation.

16. The memory system of claim 15 further comprising a sense amplifier coupled to the read bitline multiplexer and configured to read a content of a selected memory cell.

17. The memory system of claim 16 wherein the sense amplifier is further configured to precharge a single one of the read bitlines at a time in a read operation.

18. The memory system of claim 16 further comprising a control block, the control block coupled to the row decoder, the column decoder, the read bitline multiplexer, and the sense amplifier and configured to produce control signals in read and write operations.

19. The memory system of claim 15 further comprising a transconducting device coupled to the matrix of memory cells and configured to toggle a select one of the plurality of memory cells to have a desired data content and requiring no precharge of a bitline coupled to the plurality of memory cells.

20. A memory system comprising:
a memory cell array, the memory cell array being a matrix of memory cells organized by rows and columns, each of the memory cells accessible by a pair of write ports and a read port, each column of the memory cells being commonly coupled by a bitline pair and a read bitline;
a row decoder, the row decoder coupled to each pair of write ports and each read port, the row decoder configured to receive a storage location address and couple a subset of pairs of write ports and a subset of read ports to respective bitline pairs and respective read bitlines corresponding to the storage location address;
a column decoder, the column decoder coupled to each of the pairs of write ports in the memory cell array and configured to access a subset of the pairs of write ports in a single column of memory cells at a time in a memory cell write operation;
a read bitline multiplexer, the read bitline multiplexer coupled to the read ports of the memory cell array and configured to select a subset of the read ports corresponding to a single column of memory cells at a time in a memory cell read operation;
a sense amplifier, the sense amplifier coupled to the read bitline multiplexer and configured to read a data content from a selected memory cell, the sense amplifier further configured to precharge a single one of the read bitlines at a time in a read operation; and
a control block, the control block coupled to the row decoder, the column decoder, the read bitline multiplexer, and the sense amplifier and configured to produce control signals in read and write operations.

21. A memory system comprising:
a plurality of memory cells, at least select ones of the plurality of memory cells each being accessible by a read port and a pair of write ports such that there is a plurality of read ports and a plurality of pairs of write ports, the select ones of the plurality of memory cells to allow simultaneous reading and writing of the memory cells;
a row decoder coupled to the read ports and the pairs of write ports; and
a column decoder coupled to the pairs of write ports of the select ones of the plurality of memory cells and configured to access a subset of the pairs of write ports in a single column of the memory cells at a time in a memory cell write operation.

22. The memory system of claim 21, further comprising a read bitline multiplexer coupled to the read ports of the select ones of the plurality of memory cells and configured to select a subset of the read ports corresponding to a single column of memory cells at a time in a memory cell read operation.

23. The memory system of claim 22, further comprising a sense amplifier coupled to the read bitline multiplexer and configured to read a data content from a selected memory cell.

24. The memory system of claim 23, wherein the sense amplifier is further configured to precharge a single one of a plurality of read bitlines at a time in a read operation.

25. The memory system of claim 21, further comprising a control block configured to produce control signals in read and write operations.

26. A memory system comprising:
a plurality of memory cells, at least select ones of the plurality of memory cells being accessible by a read port and a pair of write ports, the select ones of the plurality of memory cells to allow simultaneous reading and writing of the memory cells;
a row decoder coupled to the read port and the pair of write ports of the select ones of the plurality of memory cells; and
a read bitline multiplexer coupled to the read port of the select ones of the plurality of memory cells and configured to select a subset of read ports corresponding to a single column of memory cells at a time in a memory cell read operation.

27. The memory system of claim 26, further comprising a sense amplifier coupled to the read bitline multiplexer and configured to read a data content from a selected memory cell.

28. The memory system of claim 27, wherein the sense amplifier is further configured to precharge a single one of a plurality of read bitlines at a time in a read operation.

29. The memory system of claim 26, further comprising a control block configured to produce control signals in read and write operations.

30. The memory system of claim 26, further comprising a transconducting device coupled to the plurality of memory cells and configured to toggle a select one of the plurality of memory cells to have a desired data content and requiring no precharge of a bitline coupled to the plurality of memory cells.

* * * * *